United States Patent [19]
Okano et al.

[11] Patent Number: 5,494,543
[45] Date of Patent: Feb. 27, 1996

[54] PROCESS FOR PRODUCING VIBRATOR FOR PIEZOELECTRIC MOTOR

[75] Inventors: Hiroshi Okano; Hironobu Ito; Masao Kasuga, all of Tokyo, Japan

[73] Assignee: Seiko Instruments Inc., Japan

[21] Appl. No.: 49,156

[22] Filed: Apr. 19, 1993

[30] Foreign Application Priority Data

Apr. 17, 1992 [JP] Japan .................................. 4-098333

[51] Int. Cl.⁶ ...................................................... B44C 1/22
[52] U.S. Cl. .................... 216/33; 216/41; 216/99
[58] Field of Search ........................ 156/630, 633, 156/643, 650, 657, 659.1, 662; 29/25.35, 621.1; 310/321–325, 367–371; 73/570, 587, 589, 649, 704, 754; 216/33, 41, 99

[56] References Cited

U.S. PATENT DOCUMENTS 4,764,244  8/1988  Chitty et al. ......................... 156/630

Primary Examiner—William Powell
Attorney, Agent, or Firm—Adams & Wilks

[57] ABSTRACT

A vibrator for a piezoelectric motor is produced by forming an elastic material into a predetermined shape, forming a piezoelectric material on the shaped elastic material for polarization and for driving, forming an electrode for polarization on the piezoelectric material, forming an electrode for driving on the surface of the electrode for polarization or on the piezoelectric material after stripping the electrode for polarization, and etching the elastic material into a predetermined shape has an elastic body and to remove the elastic body from a base. Instead of forming the piezoelectric material on the shaped elastic material for polarization and for driving, an electrode both for polarization and for driving can be formed on one face of the shaped elastic material, and the piezoelectric material can be formed on that electrode.

16 Claims, 5 Drawing Sheets

PROCESS FOR PRODUCING VIBRATOR FOR PIEZOELECTRIC MOTOR

BACKGROUND OF THE INVENTION

The present invention relates to a process for producing a vibrator for a piezoelectric motor.

Conventionally, processing of an elastic body of a vibrator for a piezoelectric motor is conducted according to steps shown by a flow chart of FIG. 5. For example, roughing of a metallic material into a freely chosen shape of an elastic body is conducted (Step 501), and next, finishing by cutting the material into a predetermined shape is conducted (Step 502). The step of roughing is described in the following according to a process of producing an elastic body shown in FIG. 6. For example, in order to obtain the elastic body shown in FIG. 6(c), roughing of a metallic material 61 shown in FIG. 6(a) is conducted to make the metallic material 61 have a predetermined thickness and the shape of a disc shown in FIG. 6(b). Next, finishing is conducted and an elastic body 69 having a comb-like projection part 69a is formed. The characteristics of transmission of vibration and expansion of vibration which show performance of the elastic body 69 depends on the shape of the comb-like projection part 69a formed at this finishing step.

On the other hand, processing of a piezoelectric element of a vibrator for a piezoelectric motor is conducted, for example, by conducting finishing of the outline and the thickness of a piezoelectric ceramics material into a predetermined shape by way of cutting and lapping the piezoelectric ceramics material, forming an electrode, conducting polarization processing for imparting piezoelectric activity to the piezoelectric ceramics material, and forming an electrode for driving.

A vibrator is obtained by fixedly attaching the elastic body to the piezoelectric element, which elastic body and piezoelectric element are obtained in the abovementioned processing (Step 503).

However, in the conventional process for producing a vibrator, the outline of a vibrator which has a close relationship with the working characteristics of a piezoelectric motor should be finished very carefully. Further, handling of a piezoelectric element and an elastic body when they are fixedly attached to each other is done one by one. These limitations result in high manufacturing cost and instability of yield in manufacturing of a piezoelectric motor. In addition, the cutting processing applied to an elastic body causes mechanical deformation or thermal deformation of a cutting edge and a machine, which makes it difficult to process a workpiece in minute detail with high accuracy.

The present invention is made to solve the abovementioned problems. The object of the present invention is to provide a process for producing a vibrator for a piezoelectric motor with which mass production with batch processing like production of semiconductors is materialized, the manufacturing time is shortened, and the manufacturing cost is lowered, and, with which processing in minute detail with high accuracy is easily conducted for attaining miniaturization and advanced performance of a piezoelectric motor.

BRIEF SUMMARY OF THE INVENTION

In order to obtain a process for producing a vibrator for a piezoelectric motor with which processing in minute detail with high accuracy is easily conducted for attaining miniaturization and advanced performance of a piezoelectric motor, according to the present invention, the problems of the prior art are solved by the following methods.

Method 1

An elastic material which can be elastically deformed is processed to have a predetermined shape, an electrode both for polarization and for driving is formed on one side of the elastic material, a piezoelectric material is formed on the electrode both for polarization and for driving, an electrode for polarization is formed on the piezoelectric material, an electrode for driving is formed with the electrode for polarization remaining or after the electrode for polarization is stripped, and the elastic material which is processed to have a predetermined shape is etched.

Method 2

The process of Method 1 is conducted, except that the step of forming the electrode both for polarization and for driving is omitted.

Method 3

The process of Method 1 is conducted, wherein a step of forming insulation on one side of the elastic material is added after the elastic material which can be elastically deformed is processed to have a predetermined shape.

Method 4

The process of Method 1, 2, or 3 is conducted, wherein etching of the elastic material is conducted after the elastic material is processed to have a predetermined shape, after the insulating film is formed, after the electrode both for polarization and for driving is formed, after the piezoelectric material is formed, or after the electrode for polarization is formed.

Method 5

The process of Method 1, 2, 3, or 4 is conducted, wherein a vibrator which is produced or the elastic material is connected with a base so that the produced vibrator may not be cut off from the base, with the electrode both for polarization and for driving, the piezoelectric material, the electrode for polarization, the electrode for driving, or the insulating film being a connecting portion.

Method 6

An elastic material which can be elastically deformed is processed to have a predetermined shape, the elastic material is etched to form a elastic body, and the elastic body and a piezoelectric element are fixedly attached to each other.

In processing to make a workpiece have a predetermined shape, roughing is conducted with regard to its thickness and outline, and cutting, grinding, etching, forming a film, metalizing (processing with regard to its own nature such as ion injection), and the like are used.

At the step of etching, the shape of a vibrator including, for example, a comb-like projection part which has the function of expansion of vibration is processed with high precision at a high grade.

Here, the term "etching" means, when the case of silicon is taken, wet etching using potassium hydroxide solution and the like, dry etching using SF6 and the like, sandblasting, and the like.

In a process for producing a vibrator for a piezoelectric motor according to the present invention, as etching is used in processing of a vibrator, processing of one or more vibrators can be conducted at the same time. Therefore, machining time for one vibrator is substantially shortened, and in addition, manufacturing cost can be lowered. Further, etching is more advantageous than cutting in processing in minute detail with respect to both performance and cost.

Accordingly, miniaturization of a vibrator, and further, miniaturization of a piezoelectric motor is made to be easy.

BRIEF DESCRIPTION OF THE DRAWINGS

The invention will be more particularly described with reference to the accompanying drawings, in which.

DETAILED DESCRIPTION OF THE INVENTION

Figure 1:
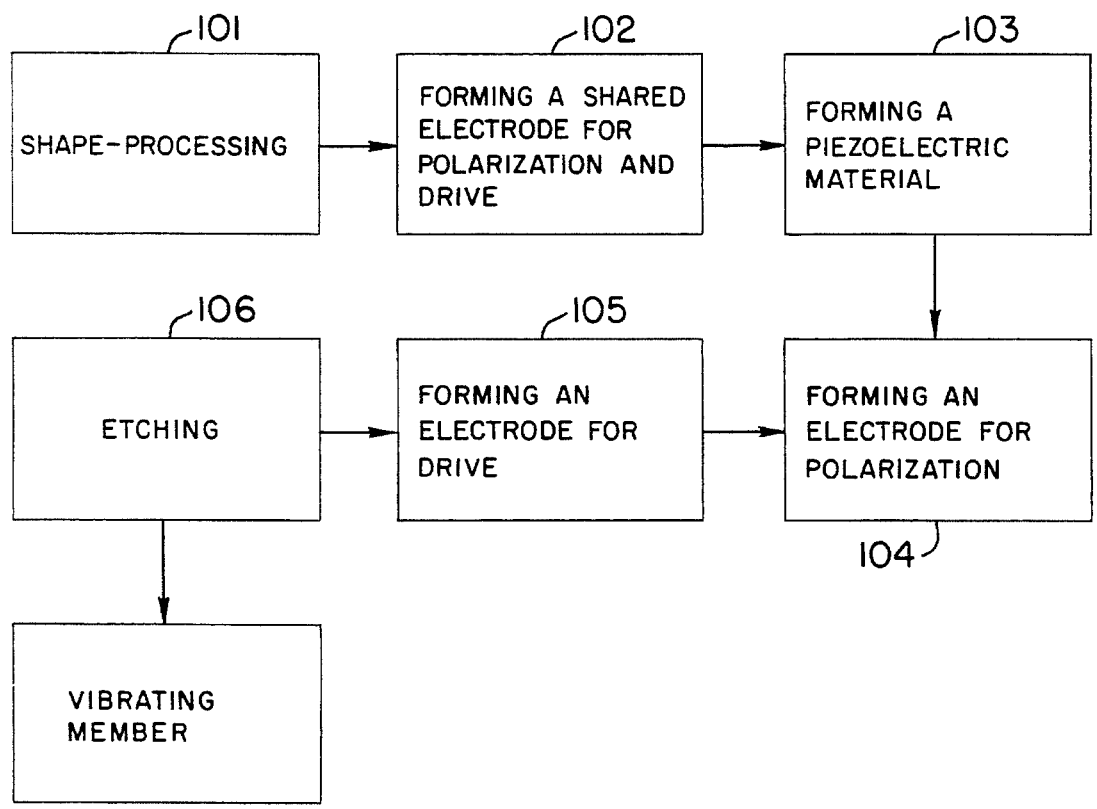
FIG. 1 is a flow chart of a first embodiment of a process for producing a vibrator for a piezoelectric motor according to the present invention.

FIG. 1 is a flow chart of a first embodiment of a process for producing a vibrator for a piezoelectric motor according to the present invention. First, an elastic material which can be elastically deformed is processed to have a predetermined thickness and shape (Step 101), and an electrode both for polarization and for driving is formed on the face of the elastic material having the predetermined thickness and shape (Step 102). Next, a piezoelectric material is formed on the face of the electrode both for polarization and for driving (Step 103). Further, an electrode for polarization is formed on the face of the piezoelectric material (Step 104). Next, an electrode for driving is formed with the electrode for polarization remaining or after the electrode for polarization is stripped (Step 105). At the end, the elastic material is etched and a vibrator for a piezoelectric motor is obtained (Step 106).

Figure 2:
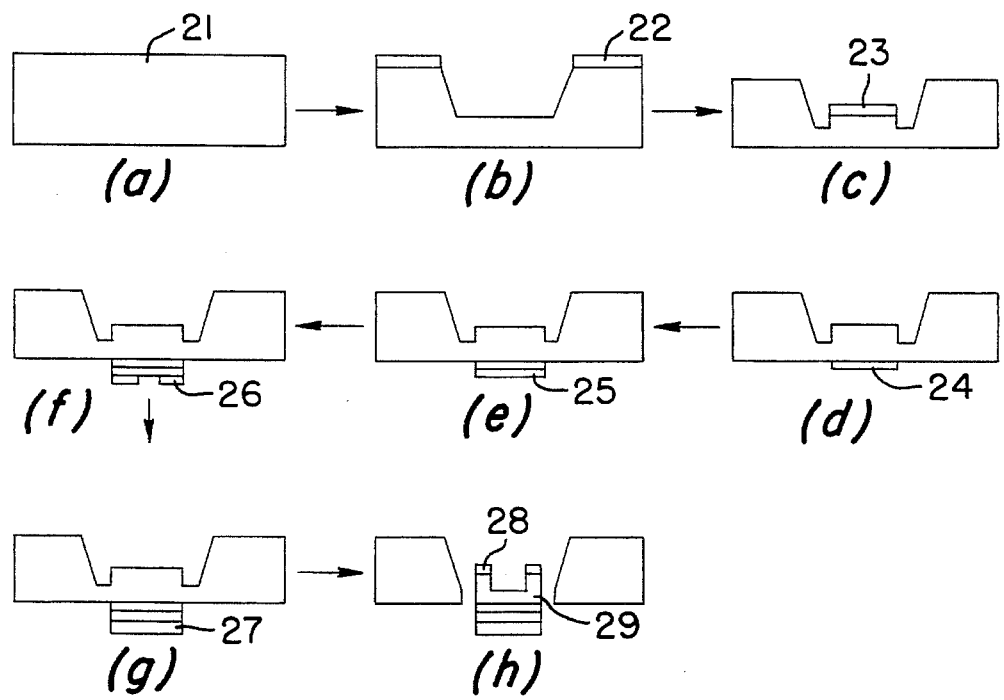
FIGS. 2 including (a) through (h) are sectional views which explain the first embodiment of a process for producing a vibrator for a piezoelectric motor according to the present invention.

FIG. 2 is a view which explains the process for producing a vibrator for a piezoelectric motor as the first embodiment of the present invention.

Step 101 of FIG. 1 is explained in the following with reference to FIG. 2. In FIG. 2(a), a silicon wafer 21 the diameter of which is 4 inches and the thickness of which is 500 microns is prepared. At the process shown in FIG. 2(b), an oxide mask 22 is formed on the silicon wafer, and a diaphragm the thickness of which is 100 microns is formed by anisotropic wet etching using TMAH (tetramethyl ammonium hydroxide). Next, in FIG. 2(c), a mask 23 is formed on the portion of the silicon wafer 21 where the diaphragm is formed, and a mesa-shaped portion of the diaphragm is formed by anisotropic dry etching of both ends of the mask. Here, CF3Br is used as reaction gas of the anisotropic dry etching, and nickel is used as the mask 23.

Next, Step 102 of FIG. 1 is explained in the following with reference to FIG. 2. In FIG. 2(d), a chrome-gold film as an electrode both for polarization and for driving 24 is formed by a sputtering on one face of the silicon wafer (the face on which a piezoelectric material is formed at the following step).

Next, Step 103 of FIG. 1 is explained in the following with reference to FIG. 2. In FIG. 2(e), by sputtering of 3 targets, a film of PZT 25 is formed and annealing is conducted.

Next, Step 104 of FIG. 1 is explained in the following with reference to FIG. 2. In FIG. 2(f), an electrode for polarization 26 of chrome-gold is formed on the face of the piezoelectric material PZT 25. Direct current voltage is applied between the electrode 26 and the electrode 24 of FIG. 2(d), and polarization of the piezoelectric material is conducted.

Next, Step 105 of FIG. 2 is explained in the following with reference to FIG. 2. In FIG. 2(g), the electrode for polarization 26 is stripped, and instead, an electrode for driving 27 is formed with chrome-gold.

Next, Step 106 of FIG. 2 is explained in the following with reference to FIG. 2. In FIG. 2(h), a mask 28 is formed on the portion of the silicon wafer where the diaphragm is formed according to a shape pattern of a vibration expansion portion. Then, anisotropic dry etching of the silicon is conducted, and by cutting off the diaphragm portion from the silicon wafer, an elastic body 29 is made. The reaction gas and the mask of the anisotropic dry etching are the same as those which are used in FIG. 2(c).

When vibrators the diameter of which is 8 mm are made according to the abovementioned process, 20 or more vibrators can be obtained at the same time with one wafer of 4 inches.

FIG. 3 is a view which explains a process for producing a vibrator for a piezoelectric motor as a second embodiment of the present invention.

Figure 3A:
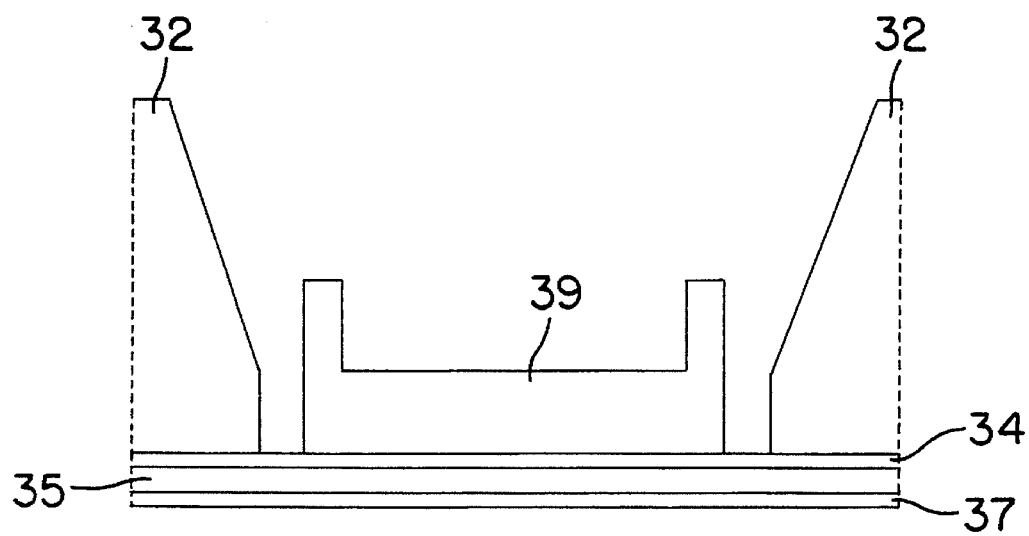
FIGS. 3(a) and 3(b) are a sectional view and a top plan view, respectively, which explain a second embodiment of a process for producing a vibrator for a piezoelectric motor according to the present invention.
Figure 3B:
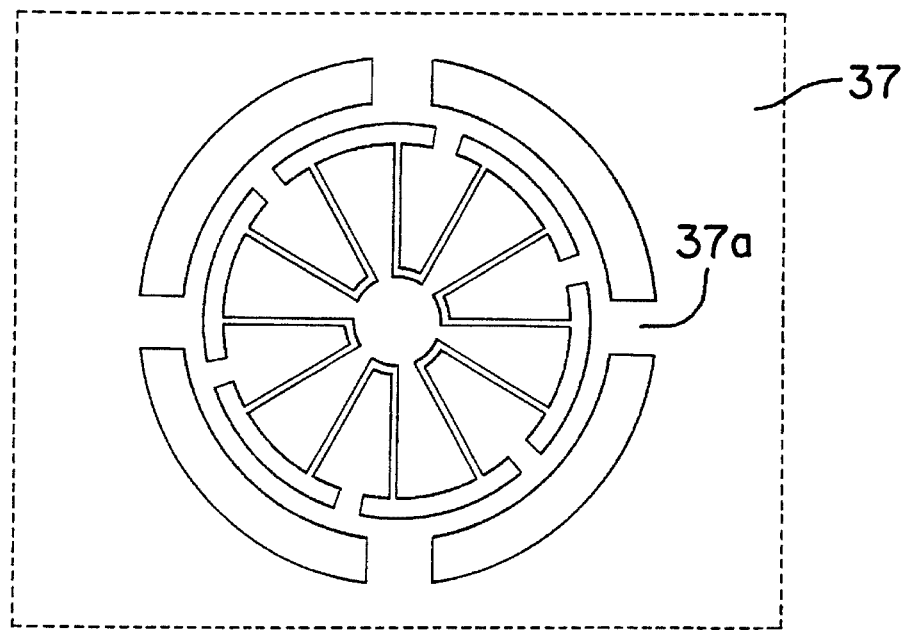

The vibrator for a piezoelectric motor is made according to the same process as in the first embodiment. FIG. 3(a) is a sectional view and FIG. 3(b) is a plan view seen from the side of an electrode for driving.

In the first embodiment, the manner of cutting off a vibrator from a wafer is described on the assumption that a vibrator is cut off from a wafer. On the other hand, in the embodiment shown in FIG. 3, by patterning, window processing is conducted with regard to each of a piezoelectric material PZT 35, an electrode both for polarization and for driving 34, and an electrode for driving 37. As a result, a connecting portion is left to the piezoelectric material 35, the electrode 34, and the electrode 37, and the silicon wafer which is etched is not cut off as a vibrator. Even after the elastic material is etched (Step 106), an elastic body 39 is fixed by a connecting portion 37a of the electrode and the piezoelectric material to the silicon wafer as a base 32. By keeping the silicon wafer in this state, handling of a vibrator can be done by handling the wafer, and accordingly, there are effects, for example, that assembly of a piezoelectric motor becomes easier.

There are the same effects with respect to a process in which no patterning is made to an electrode portion between a piezoelectric material, an electrode, or a vibrator and the base 32 as another embodiment of the present invention.

Still another embodiment is possible in which a part of a silicon wafer is not cut off, an elastic body and a base are fixed to each other, and at the end, the part of the silicon wafer is cut off by sandblasting.

A further embodiment is described in the following in which Step 106 of FIG. 1 is conducted after Step 104, 103, 102, or 101.

First, in case Step 106 is conducted after Step 104, although the yield is somewhat lowered due to problem in handling, the thickness of each of the films such as the electrodes can be made in the same way as in the first embodiment. Particularly, by forming the electrode for driving using a metallic mask, the lowering of the yield can be suppressed.

In case Step 106 is conducted after Step 103, in order to suppress breakage in handling, it is necessary to thicken the electrode material which is formed at Step 102.

Further, in case Step 106 is conducted after Step 102, it is necessary to make the thickness of the electrode material the same as the total thickness of the electrode material which is formed at Step 102 and of the piezoelectric material which is formed at Step 103.

In case Step 106 is conducted after Step 101, it is necessary to use a jig and a metallic mask with which a plurality of elastic bodies can be set at the same time, and with such a jig and a metallic mask, a vibrator for a piezoelectric motor can be produced without spoiling mass production.

However, when the vibrator is miniaturized, it is supposed that mass production becomes difficult due to problems in handling, so the abovementioned step is effective when the resistance of the elastic material is large.

Next, in case an elastic material the resistance of which is small is used, the step in which the first electrode 34 is formed (Step 102 of FIG. 1) can be omitted.

The description of the abovementioned processes made by modified to obtain still further embodiments of the present invention. The process of FIG. 1 without Step 102, the process of FIG. 1 in which Step 102 is omitted and Step 106 is conducted after Step 104, the process of FIG. 1 in which Step 102 is omitted and Step 106 is conducted after Step 103, and the process of FIG. 1 in which Step 102 is omitted and Step 106 is conducted after Step 101 are possible.

In case of the abovementioned processes in which Step 102 is omitted, problems, for example, that handling is impossible, do not arise, and to the contrary, improvement of the yield can be expected because of decrease of the number of the steps.

In case Step 102 is omitted and Step 106 is conducted after Step 104, the yield is somewhat lowered due to problem in handling, but production can be made without changing the thickness of each of the films. Particularly, by forming an electrode for driving using a metallic mask, the lowering of the yield can be suppressed.

In case Step 102 is omitted and Step 106 is conducted after Step 103, in order to suppress the lowering of the yield, it is necessary to make the thickness of the piezoelectric material which is formed at Step 103 larger than that of the piezoelectric material when Step 102 is omitted. Thus, difference of the characteristics occurs such as in the number of rotations or torque of a piezoelectric motor, compared with the case in which only omission of Step 102 is made. However, if the driving voltage is raised, the same performance can be obtained compared with the case in which only omission of Step 102 is made.

In case Step 102 is omitted and Step 106 is conducted after Step 101, as a vibrator for a piezoelectric motor is cut off from a base made of an elastic material at Step 105, the following steps are conducted using a jig and a metallic mask with which a plurality of elastic bodies can be set at the same time.

By this, a vibrator for a piezoelectric motor can be produced without spoiling the mass production.

However, as this process has a problem that the handling is made to be difficult, it is necessary to make the size of a vibrator to be produced larger.

Figure 4A:
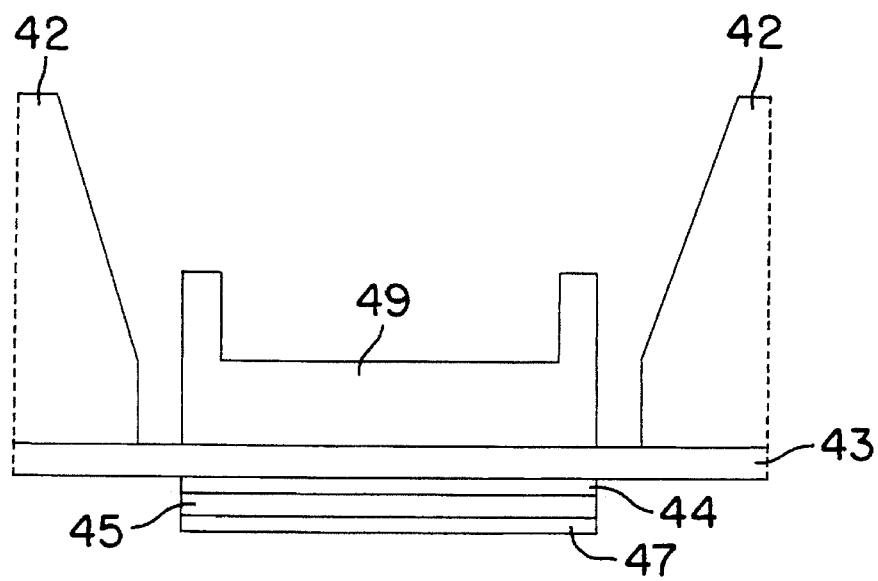
FIGS. 4(a) and 4(b) are a sectional view and a top plan view respectively which explain a third embodiment of a process for producing a vibrator for a piezoelectric motor according to the present invention.
Figure 4B:
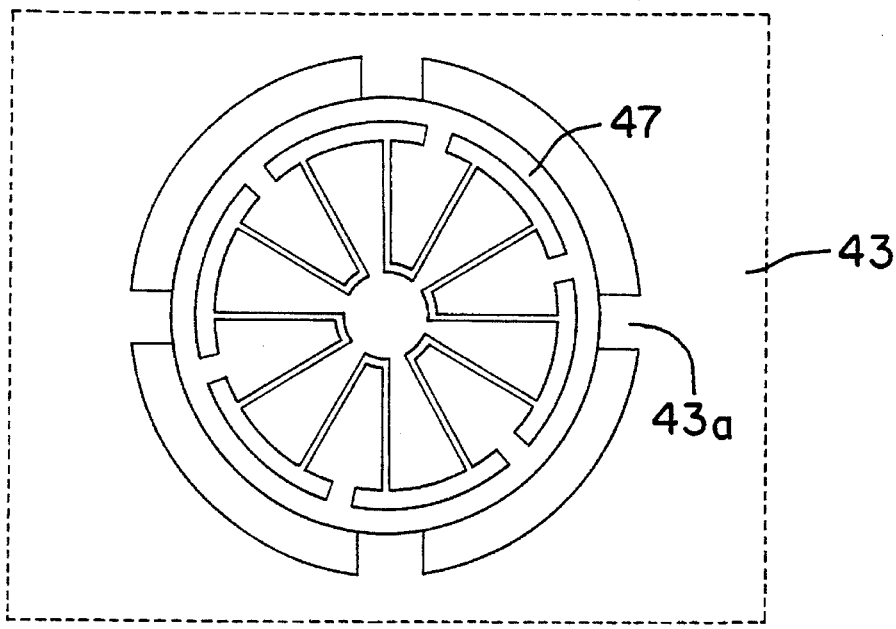
Figure 5:
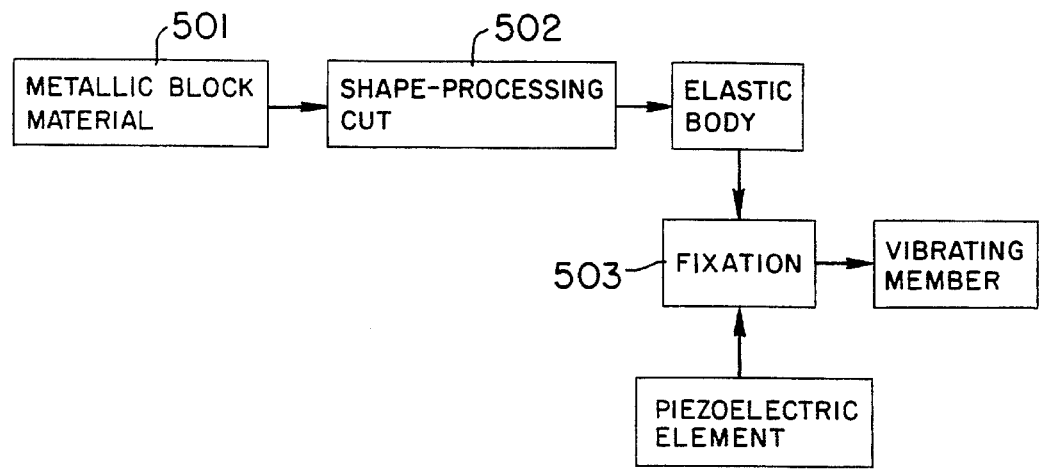
FIG. 5 is flow chart of a conventional process for producing a vibrator for a piezoelectric motor.
Figure 6A:
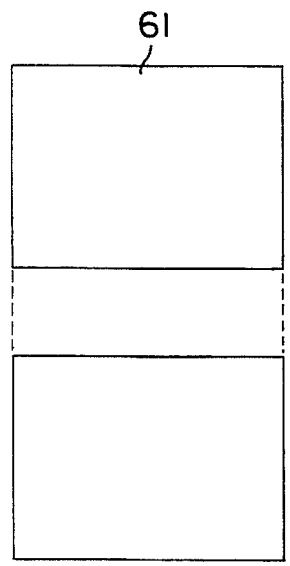
FIGS. 6(a) through 6(c) are sectional views which explain a conventional process for producing a vibrator for a piezoelectric motor.
Figure 6B:
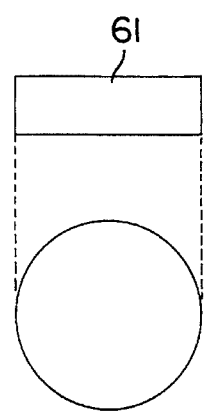
Figure 6C:
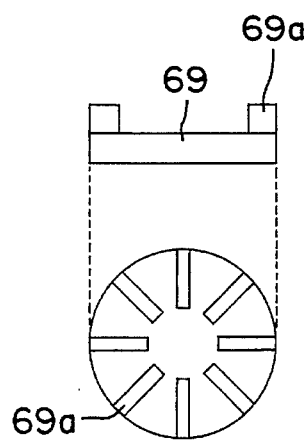

FIG. 4 is a view which explains a process for producing a vibrator for a piezoelectric motor as a third embodiment of the present invention.

In this embodiment, a step of forming an insulating film is added after Step 101 of FIG. 1.

FIG. 4(*a*) is a sectional view and FIG. 4(*b*) is a plan view seen from the side of an electrode for driving.

In this embodiment, a connecting portion 43*a* which connects an elastic body 49 with a base 42 is formed on an insulating film 43. As another embodiment, window processing may be conducted by patterning with regard to one of a piezoelectric material, an electrode both for polarization and for driving, and an electrode for driving to form a connecting portion. If the connecting portion is formed with regard to a plurality of the members, the strength is increased, but in the third embodiment, the main construction is to form the connecting portion with a single material. In this case, the vibrator can be easily cut off from the base.

As a still further embodiment of the present invention, a step of forming an insulating film is added after Step 101 of FIG. 1 and Step 106 is conducted after Step 104, 103, 102 of FIG. 1, or after the step of forming the insulating film.

When the third embodiment is compared with the abovementioned four other embodiments, The yield according to the third embodiment is best, and with regard to the four other embodiments, the more Step 106 is delayed in the process, the more the yield is improved. As the principal cause of lowering of the yield is the handling and patterning after the connecting portion is formed, the less the number of such handling and patterning becomes, the more the yield is improved. Further, if a workpiece is large, formation of a film can be conducted with a metallic mask with regard to the electrode material and the piezoelectric material, so the lowering of the yield can be suppressed. In addition, pollution of facilities including a manufacturing room by the electrode material and the piezoelectric material can be suppressed by conducting Step 106, the yield at which is worst, after the step of forming the insulating film.

Figure 7:
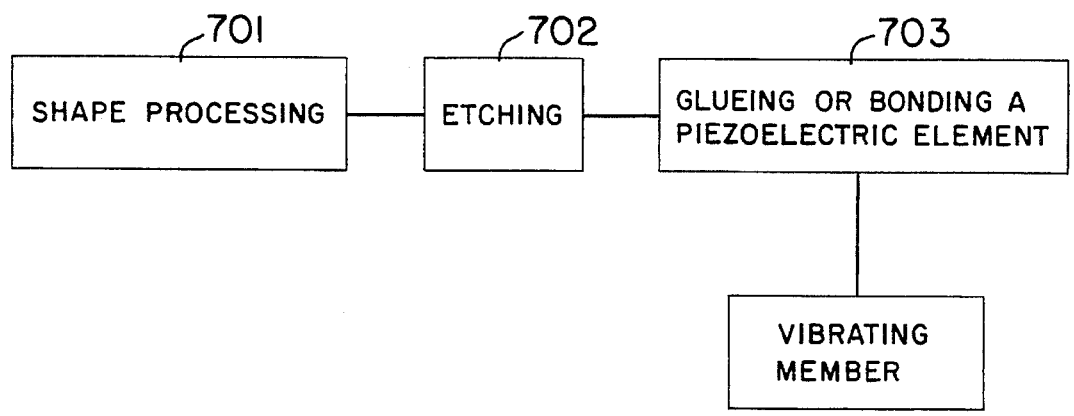
FIG. 7 is a flow chart of a fourth embodiment of a process for producing a vibrator for a piezoelectric motor according to the present invention.

FIG. 7 is a flow chart of a process for producing a vibrator for a piezoelectric motor as a fourth embodiment of the present invention.

First, an elastic material which can be elastically deformed is processed to have a predetermined thickness and shape (Step 701). Next, the elastic material is etched and an elastic body is made (Step 702). Further, the elastic body after etching and a piezoelectric element is fixedly attached to each other (Step 703), and a vibrator is finished.

Figure 8:
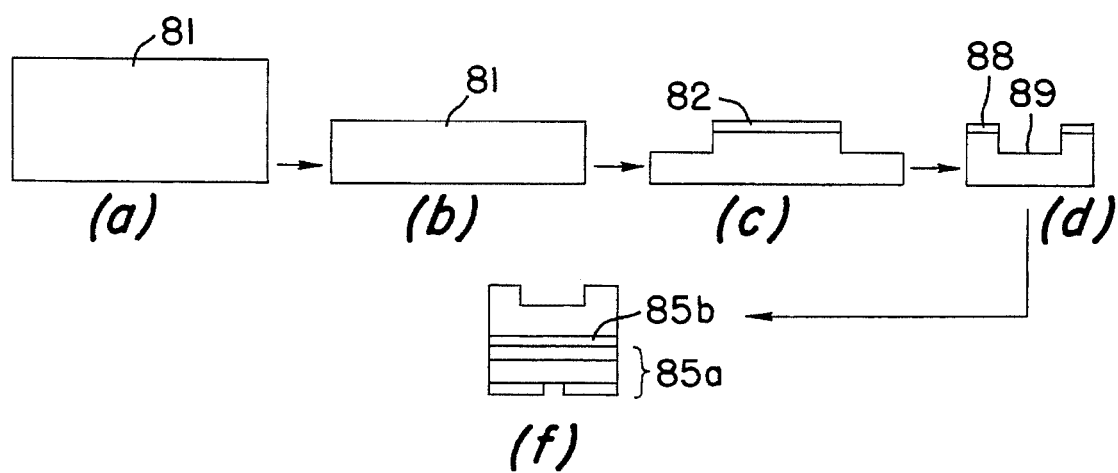
FIGS. 8 including (a) through (f) are sectional views which explain the fourth embodiment of a process for producing a vibrator for a piezoelectric motor according to the present invention.

FIG. 8 is a view for explaining the process for producing a vibrator for a piezoelectric motor as the fourth embodiment of the present invention.

Step 701 of FIG. 7 is explained in the following with reference to FIG. 8. In FIG. 8(*a*), a silicon wafer 81 the thickness of which is 500 microns is prepared. Next, in FIG. 8(*b*), the thickness of the silicon wafer 81 is made to be 200 microns by grinding. In FIG. 8(c), a mask 82 is formed the size of which is the same as the size of the elastic body by anisotropic dry etching, and the portion which is not covered by the mask is etched by anisotropic dry etching until the portion has the thickness of 100 microns. The reaction gas and the mask used here are the same as those which are used in FIG. 2(c) which explains the first embodiment.

Next, Step 702 of FIG. 7 is explained in the following with reference to FIG. 8. The step of FIG. 8(d) is the same as Step 106 of the first embodiment, and a mask 88 of a shape pattern of a vibration expansion portion is used in forming an elastic body 89.

Next, Step 703 of FIG. 7 is explained in the following with reference to FIG. 8. A piezoelectric element 85a which is made according to steps which are not shown and the elastic body 89 are adhered to each other with adhesive 85b of the epoxy family and a vibrator is made.

The fourth embodiment of the present invention incorporates processing of an elastic body by etching in a conventional process for producing a vibrator. By this, a vibrator of a substantially small size compared with a conventional vibrator can be obtained.

The description above of embodiments of the present invention is mainly with regard to a case in which silicon is used as an elastic material which can be elastically deformed, but a single-crystalline material such as quartz, a polycrystalline material such as polysilicon, amorphous material such as silicon nitride or silicon oxide, a metallic material such as aluminum or stainless, or a high polymer material such as polyamide may be used as the elastic material.

Further, both piezoelectric ceramics and piezoelectric polymer of the same level of a machine quality coefficient may be used as the piezoelectric material, but in case a piezoelectric polymer of smaller Young's modulus is used, the driving torque of the piezoelectric motor becomes small.

Still further, annealing may not be conducted with regard to the piezoelectric material after film formation, but annealing results in higher conversion efficiency of electrical input—force output.

In addition, the polarization processing can be done at any of the steps as far as the electrode elements have already sandwiched the piezoelectric material. In the above embodiments, the position of the polarization processing step is determined so that the whole process goes smoothly.

As described, since processing of a vibrator is conducted by etching, processing of one or more vibrators can be conducted at the same time. Therefore, machining time for one vibrator is substantially shortened, and in addition, manufacturing cost can be lowered.

Further, etching is more advantageous than cutting in processing in minute detail with respect to both performance and cost. Accordingly, miniaturization of a vibrator becomes easy, and further, miniaturization of a piezoelectric motor becomes easy.

In addition, as an appropriate process for the size of a vibrator to be made can be selected, there is an effect that productivity is improved.

What is claimed is:

1. A process for producing a vibrator for a piezoelectric motor which is made of a piezoelectric element and an elastic body, which displaces the elastic body by applying voltage to a plurality of electrode patterns disposed on the piezoelectric element, and which thus rotates a rotatable body that is in contact with the elastic body, the process comprising the steps of:

forming in a shape an elastic material which can be elastically deformed;

forming an electrode both for polarization and for driving on one face of the elastic material after the step of forming in a shape;

forming a piezoelectric material on the electrode both for polarization and for driving;

forming an electrode for polarization on the piezoelectric material;

forming an electrode for driving on the surface of the electrode for polarization, or forming an electrode for driving after stripping the electrode for polarization from the piezoelectric material; and etching for forming the elastic material in a shape of the elastic body and for removing the elastic body from a base.

2. A process for producing a vibrator for a piezoelectric motor as claimed in claim 1, wherein a step of forming an insulating film on one face of the elastic material which can be elastically deformed is added after the step of forming the elastic material in a shape.

3. A process of producing a vibrator for a piezoelectric motor as claimed in claim 2, wherein a step for etching the elastic material is added after the step of forming the elastic material in a shape, after the step of forming an insulating film, after the step of forming an electrode both for polarization and for driving, after the step of forming a piezoelectric material, or after the step of forming an electrode for polarization.

4. A process of producing a vibrator for a piezoelectric motor as claimed in claim 1, wherein the etching is conducted with at least one connecting portion between the vibrator or the elastic body and the base.

5. A process for producing a vibrator for a piezoelectric motor which is made of a piezoelectric element and an elastic body, which displaces the elastic body by applying voltage to a plurality of electrode patterns disposed on the piezoelectric element, and which thus rotates a rotatable body that is in contact with the elastic body, the process comprising the step of:

forming in a shape an elastic material which can be elastically deformed;

forming a piezoelectric material on the elastic material for polarization and for driving;

forming an electrode for polarization on the piezoelectric material;

forming an electrode for driving on the surface of the electrode for polarization, or forming an electrode for driving after stripping the electrode for polarization from the piezoelectric material; and etching for forming the elastic material in a shape of the elastic body and for removing the elastic body from a base.

6. A process of producing a vibrator for a piezoelectric motor as claimed in claim 5, wherein a step for etching the elastic material is added after the step of forming the elastic material in a shape, after the step of forming a piezoelectric material, or after the step of forming an electrode for polarization.

7. A process of producing a vibrator for a piezoelectric motor as claimed in claim 5, wherein the etching is conducted with at least one connecting portion between the vibrator or the elastic body and the base.

8. A process for producing a vibrator for a piezoelectric motor as claimed in claim 2, wherein the etching is conducted with at least one connecting portion between the vibrator and the base.

9. A process for producing a vibrator for a piezoelectric motor as claimed in claim 8, wherein the at least one connecting portion comprises the electrode both for polarization and for driving, the piezoelectric material, the electrode for polarization, the electrode for driving, or the insulating film.

10. A process for producing a vibrator for a piezoelectric motor as claimed in claim 3, wherein the etching is conducted with at least one connecting portion between the vibrator and the base.

11. A process for producing a vibrator for a piezoelectric motor as claimed in claim 10, wherein the at least one connecting portion comprises the electrode both for polarization and for driving, the piezoelectric material, the electrode for polarization, the electrode for driving, or the insulating film.

12. A process for producing a vibrator for a piezoelectric motor as claimed in claim 4, wherein the at least one connecting portion comprises the electrode both for polarization and for driving, the piezoelectric material, the electrode for polarization, or the electrode for driving.

13. A process for producing a vibrator for a piezoelectric motor as claimed in claim 6, wherein the etching is conducted with at least one connecting portion between the vibrator and the base.

14. A process for producing a vibrator for a piezoelectric motor as claimed in claim 13, wherein the at least one connecting portion comprises the piezoelectric material, the electrode for polarization, or the electrode for driving.

15. A process for producing a vibrator for a piezoelectric motor as claimed in claim 7, wherein the at least one connecting portion comprises the piezoelectric material, the electrode for polarization, or the electrode for driving.

16. In a process for producing a vibrator for a piezoelectric motor which is made of a piezoelectric element and an elastic body, which displaces the elastic body by applying voltage to a plurality of electrode patterns disposed on the piezoelectric element, and which thus rotates a rotatable body that is in contact with the elastic body, the improvement comprising the steps of:

forming an elastic material into a shape which can be elastically deformed;

etching the shaped elastic material to form the elastic body; and attaching the piezoelectric element to the elastic body with adhesive.

* * * * *